(12) United States Patent
Cheng (10) Patent No.: US 10,985,270 B2
(45) Date of Patent: Apr. 20, 2021

(54) NITRIDE POWER TRANSISTOR AND MANUFACTURING METHOD THEREOF

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 0 days.

(21) Appl. No.: 16/204,289

(22) Filed: Nov. 29, 2018

(65) Prior Publication Data
US 2019/0140088 A1    May 9, 2019

Related U.S. Application Data

(63) Continuation of application No. 15/099,662, filed on Apr. 15, 2016, now abandoned, which is a continuation of application No. PCT/CN2014/071352, filed on Jan. 24, 2014.

(30) Foreign Application Priority Data

Oct. 15, 2013    (CN) .......................... 201310482335.7

(51) Int. Cl.
| H01L 29/778 | (2006.01) |
| H01L 29/66 | (2006.01) |
| H01L 29/20 | (2006.01) |
| H01L 21/02 | (2006.01) |
| H01L 29/06 | (2006.01) |

(52) U.S. Cl.
CPC ...... *H01L 29/7787* (2013.01); *H01L 21/0254* (2013.01); *H01L 21/02381* (2013.01); *H01L 21/02573* (2013.01); *H01L 29/0611* (2013.01); *H01L 29/0634* (2013.01); *H01L 29/2003* (2013.01); *H01L 29/66462* (2013.01); *H01L 29/7783* (2013.01); *H01L 29/7786* (2013.01)

(58) Field of Classification Search
CPC ............. H01L 29/7787; H01L 29/7786; H01L 29/0611; H01L 29/7783; H01L 29/2003; H01L 29/66462
See application file for complete search history.

(56) References Cited

U.S. PATENT DOCUMENTS

| 2005/0035371 A1* | 2/2005 | Fujihira | ............... | H01L 29/0619 257/200 |
| 2006/0118824 A1* | 6/2006 | Otsuka | ................ | H01L 29/7787 257/194 |
| 2008/0017897 A1* | 1/2008 | Saito | ................... | H01L 23/3192 257/288 |

(Continued)

*Primary Examiner* — Michele Fan
(74) *Attorney, Agent, or Firm* — Flener IP & Business Law; Zareefa B. Flener (57) ABSTRACT

A nitride power transistor comprises: a silicon substrate comprising a differently doped semiconductor composite structure for forming a space charge depletion region; and a nitride epitaxial layer located on the silicon substrate. With introduction of a differently doped semiconductor composite structure for forming a space charge depletion region inside a silicon substrate of a nitride power transistor, the nitride power transistor is capable of withstanding a relatively high external voltage, and thus a breakdown voltage of the device is improved.

15 Claims, 9 Drawing Sheets

(56) References Cited

U.S. PATENT DOCUMENTS

| | | | |
|---|---|---|---|
| 2008/0191305 A1* | 8/2008 | Khemka | H01L 29/0634 257/481 |
| 2009/0045438 A1* | 2/2009 | Inoue | H01L 29/155 257/192 |
| 2012/0098036 A1* | 4/2012 | Bahl | H01L 29/0661 257/194 |
| 2013/0105811 A1* | 5/2013 | Ando | H01L 29/2003 257/76 |
| 2013/0221409 A1* | 8/2013 | Nakajima | H01L 27/095 257/194 |
| 2013/0256681 A1* | 10/2013 | Wang | H01L 29/365 257/76 |
| 2015/0318360 A1* | 11/2015 | Lu | H01L 21/8258 257/192 |

* cited by examiner

NITRIDE POWER TRANSISTOR AND MANUFACTURING METHOD THEREOF

CROSS-REFERENCE TO RELATED APPLICATIONS

This application is a continuation of U.S. application Ser. No. 15/099,662 field on Apr. 15, 2016, which is a continuation of International Patent Application No. PCT/CN2014/071352 filed on Jan. 24, 2014, which claims priority of Chinese Patent Application No. 201310482335.7 filed on Oct. 15, 2013, the contents of which are incorporated by reference herein in their entirety.

TECHNICAL FIELD

The present invention relates to microelectronics technology, in particular, relates to a nitride power transistor and a method of manufacturing the nitride power transistor.

BACKGROUND

As the third-generation semiconductor material, Gallium Nitride (GaN) has become a hot research topic due to its features such as large band gap, high electron saturation velocity, high breakdown voltage and good thermal conductivity. In aspects of electrical devices, compared with silicon and gallium arsenide, gallium nitride material is more suitable to be used to manufacture electronic devices which are capable of withstanding high temperature, high frequency, high pressure and has high power, thus gallium nitride based electronic devices have broad application prospects.

In the past, gallium nitride power transistors were manufactured on sapphire substrates or silicon carbide substrates. Due to particularity and processing difficulty of gallium nitride heterojunction conductive channels, most gallium nitride power transistors have flat structures. Because of thick substrates and high breakdown voltages, the devices are usually broken down transversely. Some plane optimization techniques, such as using field plate structure and increasing the distance between a gate electrode and a drain electrode, can be used to increase the breakdown voltages of the devices, however, the materials used for sapphire substrates and silicon carbide substrates are expensive and difficult to manufacture substrates and epitaxial layers with large sizes, so the gallium nitride power transistors are costly and difficult to be commercialized.

At present, the technology of manufacturing gallium nitride power transistors on large-size silicon substrates is becoming mature and costs are lowering, which facilitates commercialization of gallium nitride power transistors. However, due to the electrical conductivity of the silicon materials and their low critical electric fields, every silicon-based gallium nitride power transistor has a saturation breakdown voltage, which is determined by the thickness of the nitride epitaxial layer grown on a silicon substrate. In addition, to avoid electrostatic discharge (ESD) caused by accumulation of static electricity in the devices and realize voltage matching in the circuits, it is necessary to ground the substrates, which reduces the breakdown voltage half when a substrate of a silicon-based gallium nitride power transistor is grounded. Therefore, improving breakdown voltage of the nitride power transistors on the silicon substrates is an urgent problem currently.

Therefore, in order to address the above-described technical issues, it is required to provide a nitride power transistor and a manufacturing method thereof.

SUMMARY

In view of this, an object of the present invention is to provide a nitride power transistor having a high breakdown voltage and a manufacturing method thereof. With introduction of longitudinal P-type doped semiconductor layers and N-type doped semiconductor layers inside a silicon substrate through epitaxial doping or ion implantation, a space charge region is formed inside the P-type doped semiconductor layers and the N-type doped semiconductor layers. Conductive electrons and holes inside the space charge region are completely exhausted so that conductive channels do not exist, similar to a high-resistance region, thus the nitride power transistor can withstand a certain external voltage. The bearable voltage of the space charge region depends on its height. The higher the space charge region is, the higher voltage it can withstand.

The space charge region formed by the P-type doped semiconductor layers and the N-type doped semiconductor layers introduced in the silicon substrate serves as a high-voltage-resistance layer inserted in the conductive silicon substrate, which improves the voltage resistance of the silicon substrate and hence improves the breakdown voltage of the whole device. Especially when the silicon substrate is grounded, the longitudinal breakdown voltage between the drain electrode and the substrate electrode is greatly increased.

To achieve the above object, a technical scheme according to an embodiment of the present invention is provided as follows.

A nitride power transistor comprises: a silicon substrate comprising a differently doped semiconductor composite structure for forming a space charge depletion region; and a nitride epitaxial layer located on the silicon substrate.

Preferably, the semiconductor composite structure is a multi-level structure formed by transversely alternating n-type semiconductor and p-type semiconductor.

Preferably, a longitudinal section of the semiconductor composite structure has one of a longitudinal vertical arrangement, a triangular arrangement and a square arrangement or any combination thereof, a cross section of the semiconductor composite structure has one of a longitudinal alternating grid arrangement, a longitudinal alternating triangular arrangement, a longitudinal alternating polygonal arrangement and a longitudinal alternating circular arrangement or any combination thereof, and the semiconductor composite structure occupies the entire silicon substrate in a transverse direction.

Preferably, a height of the n-type semiconductor and the p-type semiconductor of the semiconductor composite structure is more than 5 nm.

Preferably, doping concentration and doping distribution of each layer of the silicon substrate and the semiconductor composite structure in the silicon substrate includes light doping, graded doping, heavy doping or any combination thereof.

Preferably, the semiconductor composite structure is located at a top layer of the silicon substrate, in the middle of the silicon substrate, or at a bottom of the silicon substrate, or any combination thereof.

Preferably, semiconductor in the semiconductor doped multilayer structure is any one selected from silicon, germanium, germanium silicon, silicon carbide, III-V compound, or any combination thereof.

Preferably, the nitride power transistor further comprises a nitride epitaxial layer disposed on the nitride channel layer, two-dimensional electron gas is formed at an interface between the nitride epitaxial layer and the nitride barrier layer.

Preferably, the nitride power transistor further comprises a dielectric layer disposed on the nitride barrier layer, the dielectric layer includes one selected from SiN, $SiO_2$, SiON, $Al_2O_3$, $HfO_2$, HfAlOx and any combination thereof. The nitride power transistor further comprises a GaN capping layer disposed on the nitride barrier layer and/or an AlN insertion layer disposed between the nitride barrier layer and the nitride epitaxial layer.

Preferably, the nitride epitaxial layer comprises: a nitride nucleation layer located on the silicon substrate; a nitride buffer layer located on the nitride nucleation layer; and a nitride channel layer located on the nitride buffer layer. And the nitride power transistor further comprises a source electrode and a drain electrode contacting the nitride channel layer and a gate electrode located between the source electrode and the drain electrode.

Preferably, the nitride power transistor further comprises an AlGaN back barrier layer disposed between the nitride buffer layer and the nitride channel layer.

Preferably, regions of the nitride channel layer which are respectively located below the source electrode and the drain electrode are n-type heavily doped, and a region of the nitride channel layer which is located below the gate electrode is unintentionally doped, p-type lightly doped or n-type lightly doped.

Preferably, the nitride power transistor further comprises metal deposited at a bottom of the silicon substrate.

Corresponding, a method of manufacturing a nitride power transistor comprises: introducing a differently doped semiconductor composite structure for forming a space charge depletion region inside a silicon substrate; and growing a nitride epitaxial layer on the silicon substrate having the semiconductor composite structure.

Preferably, a manufacturing method of the semiconductor composite structure comprises etching and epitaxial growth, or ion implantation.

Preferably, the semiconductor composite structure is a multi-level structure formed by transversely alternating n-type semiconductor and p-type semiconductor.

Preferably, a longitudinal section of the semiconductor composite structure has one of a longitudinal vertical arrangement, a triangular arrangement and a square arrangement or any combination thereof, a cross section of the semiconductor composite structure has one of a longitudinal alternating grid arrangement, a longitudinal alternating triangular arrangement, a longitudinal alternating polygonal arrangement and a longitudinal alternating circular arrangement or any combination thereof, and the semiconductor composite structure occupies the entire silicon substrate in a transverse direction.

With introduction of a differently doped semiconductor composite structure for forming a space charge depletion region inside a silicon substrate of a nitride power transistor, the nitride power transistor is capable of withstanding a relatively high external voltage, and thus a breakdown voltage of the device is improved. Growing a GaN layer on the surface of the barrier layer as a protection layer can effectively decrease impact on the characteristics of the device by the surface defect and the surface state density of the barrier layer material. The AlN insertion layer increases the concentration of the two-dimensional electron gas, improves the mobility of electrons and the overall characteristics of the device. The AlGaN back barrier layer can separate the channel electrons from the buffer layer and effectively confine the two-dimensional electron gas in the channel layer, which avoids the short-channel effect and the current collapse effect.

BRIEF DESCRIPTION OF DRAWINGS

In order to more clearly illustrate the technical schemes according to the embodiments of the present invention or the prior art, the accompanying drawings used in the embodiments of the present invention or the prior art will be introduced briefly. Apparently, the accompanying drawings described below illustrate only some of the embodiments of the present invention, other accompanying drawings can be obtained by those skilled in the art based on these accompanying drawings without creative efforts.

DETAILED DESCRIPTION

The present invention will be described in detail with reference to specific embodiments illustrated in the accompanying drawings. However, the present invention is not limited to the disclosed embodiments, rather, modifications on structures, methods or functions made by those skilled in the art based on the embodiments are included within the scope of the present invention.

Further, duplicate reference numerals or identifications may be used in different embodiments. These duplications are just for describing the present invention briefly and clearly, and do not mean that there is any association between different embodiments and/or structures.

FIGS. 1A-1I is a schematic views illustrating a process of forming a semiconductor composite structure inside a silicon substrate of a nitride power transistor according to the present invention.

Figure 1A:
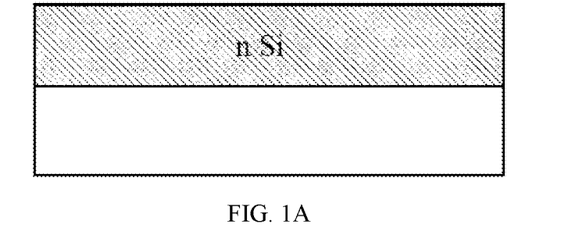
FIGS. 1A-1I and 2A-2F are schematic views illustrating processes of forming a semiconductor composite structure inside a silicon substrate of a nitride power transistor according to the present invention.
Figure 1B:
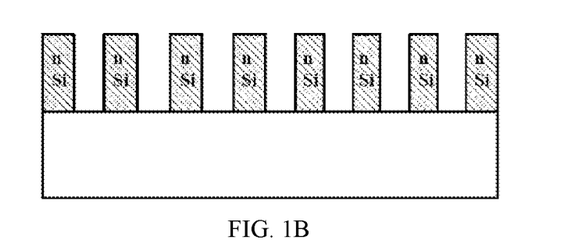
Figure 1C:
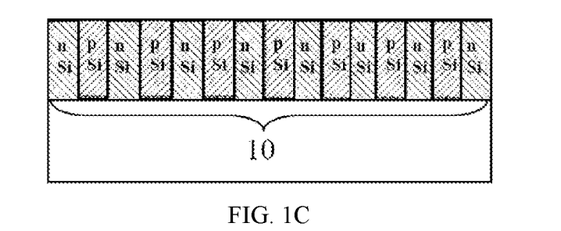
Figure 1D:
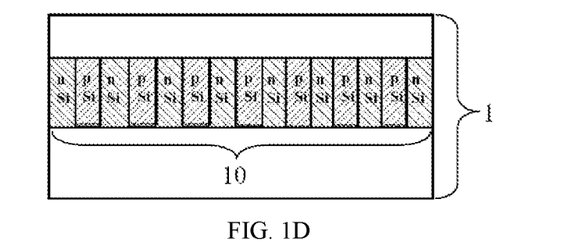
Figure 1E:
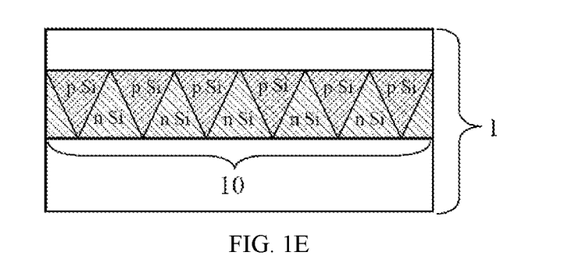
Figure 1F:
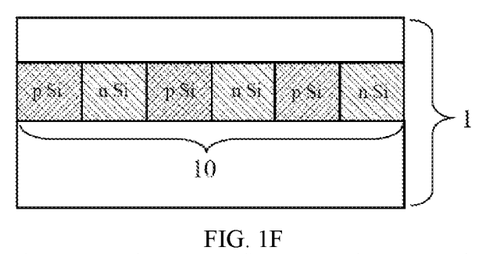
Figure 1G:
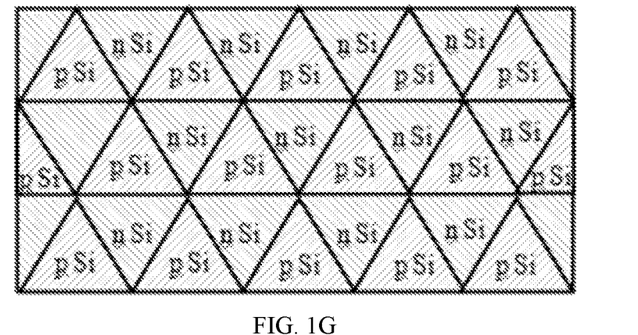
Figure 1H:
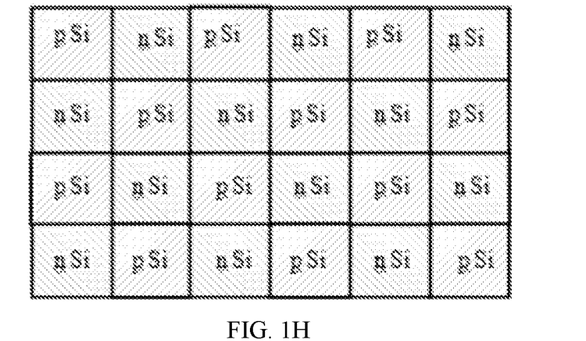
Figure 1I:
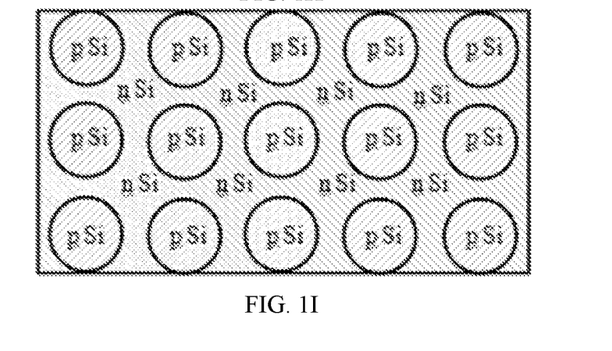

Referring to FIG. 1A, firstly an n-doped semiconductor epitaxial layer is grown on a silicon substrate. Then, referring to FIG. 1B, the n-type semiconductor epitaxial layer is etched with an etching method so as to form a comb-shaped structure. Next, referring to FIG. 1C, etched grooves of the comb-shaped structure are filled by epitaxially growing p-type semiconductor, so as to form a differently doped semiconductor composite structure 10 vertically disposed in the longitudinal direction. Then, a layer of epitaxial silicon is grown thereon, so as to form a silicon substrate having the differently doped semiconductor composite structure 10 vertically disposed in the longitudinal direction therein as shown in FIG. 1D. Here, doping concentration and doping distribution of the silicon substrate, the semiconductor composite structure in the silicon substrate and the epitaxial layers on or below the semiconductor composite structure can be optimized according to design requirements for the device and the process, and can be lightly doped, graded doped, heavily doped or any combination thereof. Since difficult deep groove etching processes will be used in forming the differently doped semiconductor composite structure with a longitudinal vertical arrangement, differently doped semiconductor composite structures having other arrangements may be used. For example, in a side view, a longitudinal section of the semiconductor composite structure has one of a longitudinal vertical arrangement, a triangular arrangement and a square arrangement or any combination thereof. In a bottom view, a cross section of the semiconductor composite structure has one of a longitudinal alternating grid arrangement, a longitudinal alternating triangular arrangement, a longitudinal alternating polygonal arrangement and a longitudinal alternating circular arrangement or any combination thereof. The semiconductor composite structure occupies the entire silicon substrate in the transverse direction. FIGS. 1E and 1F respectively illustrate semiconductor composite structures having a triangular arrangement and a square arrangement in the side view, while FIGS. 1G, 1H and 1I respectively illustrate semiconductor composite structures having a longitudinal alternating grid arrangement, a longitudinal alternating triangular arrangement and a longitudinal alternating polygonal arrangement in the bottom view.

In the present embodiment, etching and epitaxially growing is used to form the differently doped semiconductor composite structure, in other embodiments, ion implantation may be used instead to form the differently doped semiconductor composite structure. The above-described semiconductor composite structure 10 is a multi-level structure formed by transversely alternating n-type semiconductor and p-type semiconductor. The semiconductor composite structure occupies the entire silicon substrate in the transverse direction. The semiconductor in the composite structure may be any one selected from silicon, germanium, germanium silicon, silicon carbide, III-V compound, or any combination thereof. The n-type semiconductor and the p-type semiconductor generally have a height of more than 5 nm. Doping concentration, doping distribution and the overall height of the differently doped semiconductor composite structure can be adjusted according to the required bearable voltage.

Figure 2A:
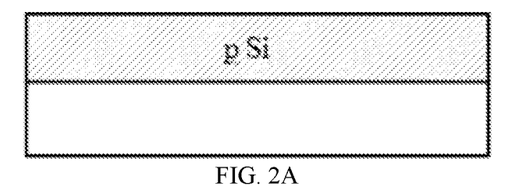
Figure 2B:
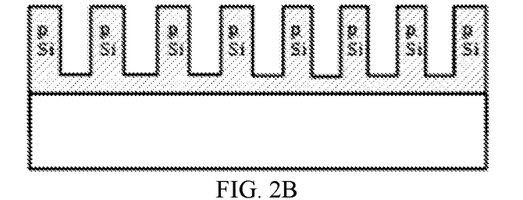
Figure 2C:
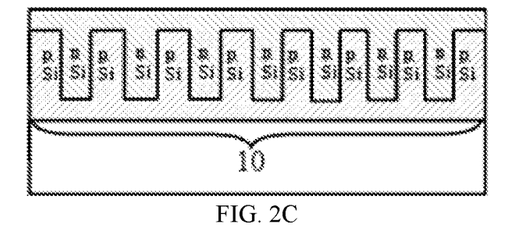
Figure 2D:
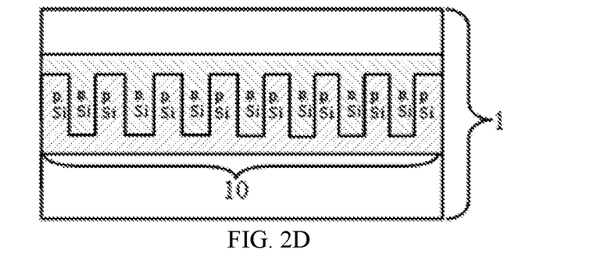
Figure 2E:
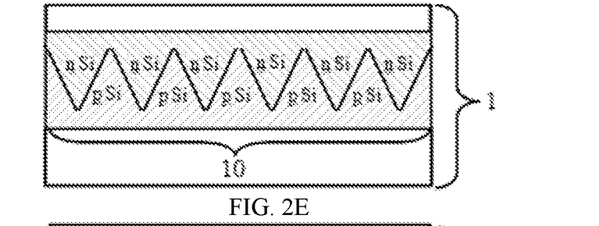
Figure 2F:
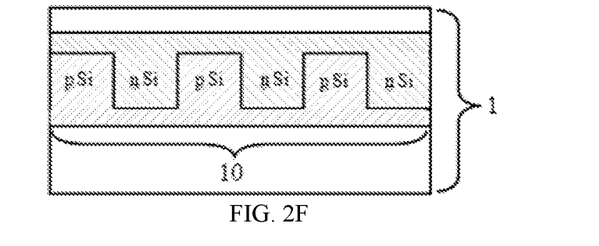

FIGS. 2A-2F is a schematic views illustrating another process of forming a semiconductor composite structure inside a silicon substrate of a nitride power transistor according to the present invention. Firstly a p-doped semiconductor epitaxial layer is grown on a silicon substrate. Then, referring to FIG. 2B, the p-type semiconductor epitaxial layer is etched with an etching method so as to form a comb-shaped structure. Next, referring to FIG. 2C, etched grooves of the comb-shaped structure are filled by epitaxially growing n-type semiconductor, so as to form a differently doped semiconductor composite structure 10 vertically disposed in the longitudinal direction. Then, a layer of epitaxial silicon is grown thereon, so as to form a silicon substrate having the differently doped semiconductor composite structure 10 vertically disposed in the longitudinal direction therein as shown in FIG. 2D. Here, doping concentration and doping distribution of the silicon substrate, the semiconductor composite structure in the silicon substrate and the epitaxial layers on or below the semiconductor composite structure can be optimized according to design requirements for the device and the process, and can be lightly doped, graded doped, heavily doped or any combination thereof. Since difficult deep groove etching processes will be used in forming the differently doped semiconductor composite structure with a longitudinal vertical arrangement, differently doped semiconductor composite structures having other arrangements may be used. For example, in a side view, a longitudinal section of the semiconductor composite structure has one of a longitudinal vertical arrangement, a triangular arrangement and a square arrangement or any combination thereof. In a bottom view, a cross section of the semiconductor composite structure has one of a longitudinal alternating grid arrangement, a longitudinal alternating triangular arrangement, a longitudinal alternating polygonal arrangement and a longitudinal alternating circular arrangement or any combination thereof. The semiconductor composite structure occupies the entire silicon substrate in the transverse direction. FIGS. 2E and 2F respectively illustrate semiconductor composite structures having a triangular arrangement and a square arrangement in the side view. In the present embodiment, etching and epitaxially growing is used to form the differently doped semiconductor composite structure, in other embodiments, ion implantation may be used instead to form the differently doped semiconductor composite structure.

Figure 3A:
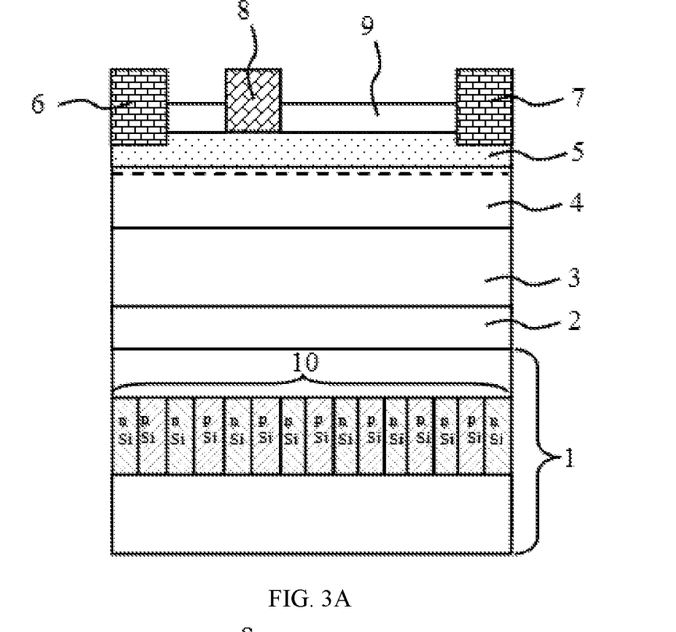
FIGS. 3A and 3B are schematic views illustrating a structure of a nitride HEMT device according to a first embodiment of the present invention.

FIG. 3A is a schematic view illustrating a structure of a nitride HEMT device according to a first embodiment of the present invention. A first layer of a nitride power transistor is a silicon substrate 1 inside which a differently doped semiconductor composite structure 10 having a longitudinal vertical arrangement is disposed. A nitride nucleation layer 2 and a nitride buffer layer 3 are epitaxially grown on the silicon substrate 1. The buffer layer 3 contains GaN, AlN or other nitrides, and is used to match substrate material and epitaxially grow the GaN layer with a high quality, and also affects crystal quality, surface morphology, electrical property and other parameters of heterojunctions made by GaN/AlGaN thereon. A nitride channel layer 4 including a non-doped GaN layer is grown on the nitride buffer layer 3. A nitride barrier layer 5 including AlGaN or other nitrides is grown on the nitride channel layer 4, and forms a semiconductor heterojunction structure together with the nitride channel layer 4. High-concentration two-dimensional electron gas is formed at the interface and a conductive channel is formed at the heterojunction interface in the GaN channel layer. A dielectric layer 9 is deposited on the nitride barrier layer 5 to protect a surface of the material through passivation. The dielectric layer includes one selected from SiN, $SiO_2$, SiON, $Al_2O_3$, $HfO_2$, HfAlOx or any combination thereof. A source electrode 6 and a drain electrode 7 are disposed on the nitride barrier layer 5, and a groove is etched in the dielectric layer 9 between the source electrode 6 and the drain electrode 7 and metal is deposited on the groove so that a gate electrode 8 is formed. Herein, the nitride nucleation layer 2, the nitride buffer layer 3 and the nitride channel layer 4 are collectively referred to as a nitride epitaxial layer.

With a certain external voltage, each layer of doped semiconductor will be completely exhausted so as to form a space charge depletion region, and the whole differently doped semiconductor composite structure will form a thick space charge depletion region, as if a relatively thick high resistance region is inserted inside the silicon substrate, thus a relatively high external voltage can be withstood. With this method, the resistance to pressure of the silicon substrate is improved, and the breakdown voltage of the nitride power transistor is improved accordingly.

Figure 3B:
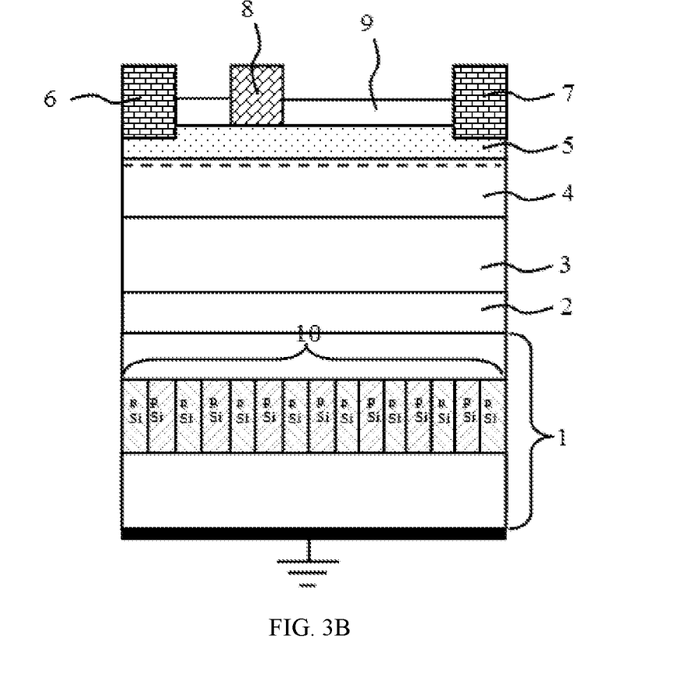

FIG. 3B is a schematic view illustrating a modified structure of a nitride HEMT device according to a first embodiment of the present invention. As a substrate ground electrode, metal is deposited at the bottom of the silicon substrate. With a certain external voltage, the whole differently doped semiconductor composite structure will be exhausted more completely so as to form a space charge depletion region with high resistance. Thus the resistance to pressure of the silicon substrate is improved, and the breakdown voltage of the nitride power transistor is improved accordingly.

Figure 4A:
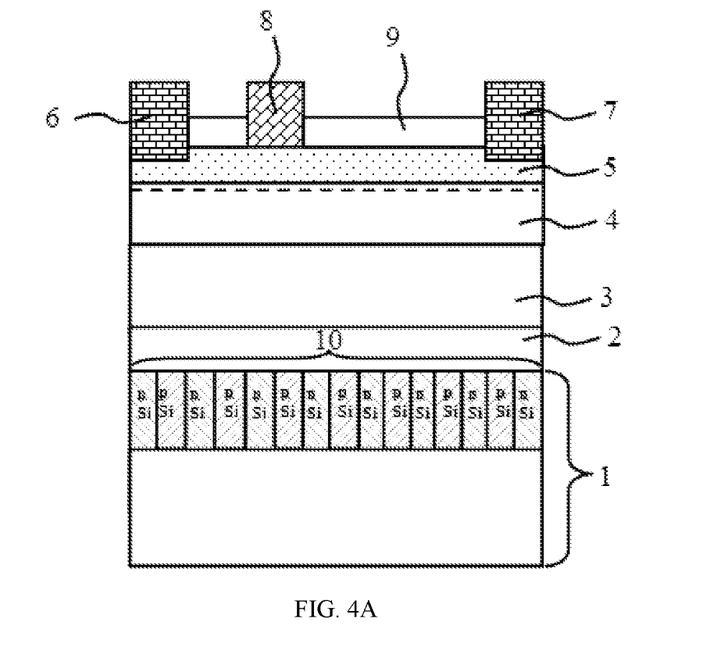
FIG. 4A is a schematic view illustrating a structure of a nitride HEMT device according to a second embodiment of the present invention.

FIG. 3A is a schematic view illustrating a structure of a nitride HEMT device according to a second embodiment of the present invention. Compared with the first embodiment, in the present embodiment, the epitaxial growth or doping process is directly performed at a top layer of the silicon substrate 1 of the nitride HEMT device, so that the differently doped semiconductor composite structure 10 is located at the top layer of the silicon substrate 1, the nitride nucleation layer 2 and the nitride buffer layer 3 may be directly grown on the differently doped semiconductor composite structure 10. Compared with the condition in which the differently doped semiconductor composite structure is located in the middle of the silicon substrate, the structure and manufacturing process thereof are simpler.

Figure 4B:
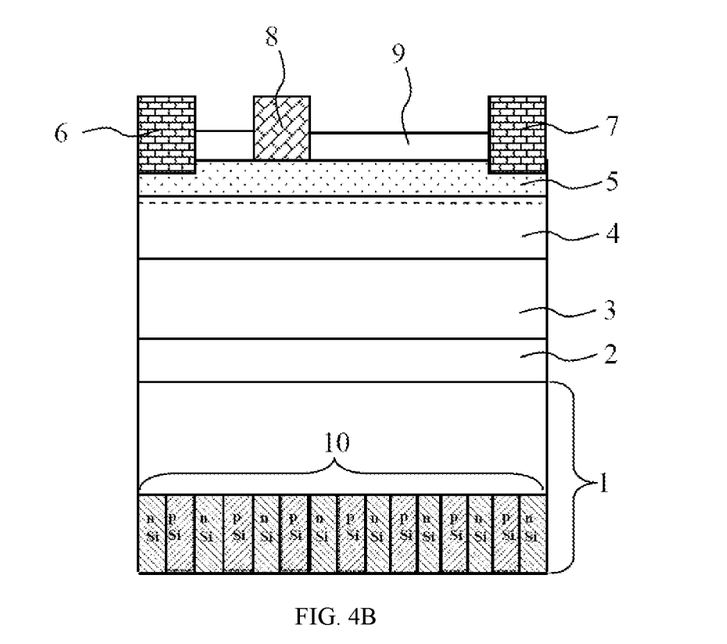
FIG. 4B is a schematic view illustrating a structure of a nitride HEMT device according to a third embodiment of the present invention.

FIG. 4B is a schematic view illustrating a structure of a nitride HEMT device according to a third embodiment of the present invention. Compared with the first embodiment, in the present embodiment, the epitaxial growth or doping process is directly performed at a bottom of the silicon substrate 1 of the nitride HEMT device, so that the differently doped semiconductor composite structure 10 is located at the bottom of the silicon substrate 1. Compared with the second embodiment, the condition in which the nitride nucleation layer 2 and the nitride buffer layer 3 are directly grown on the differently doped semiconductor composite structure 10 is avoided, thus the processing is simplified.

Figure 5:
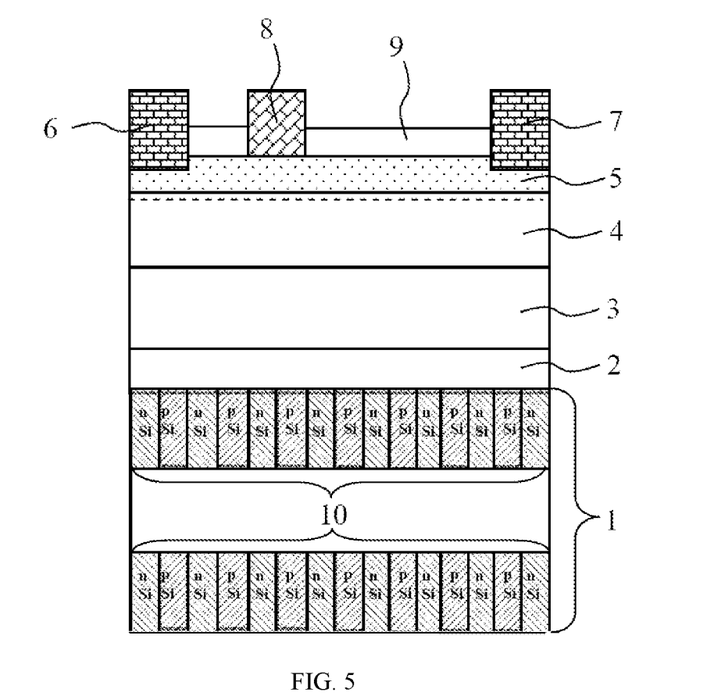
FIG. 5 is a schematic view illustrating a structure of a nitride HEMT device according to a fourth embodiment of the present invention.

FIG. 5 is a schematic view illustrating a structure of a nitride HEMT device according to a fourth embodiment of the present invention. Compared with the first embodiment, in the present embodiment, two differently doped semiconductor composite structures 10 are formed at the top layer and the bottom of the silicon substrate 1 of the nitride HEMT device respectively, thus the height of the whole space charge depletion region is increased, and the breakdown voltage of the device is further improved.

Figure 6:
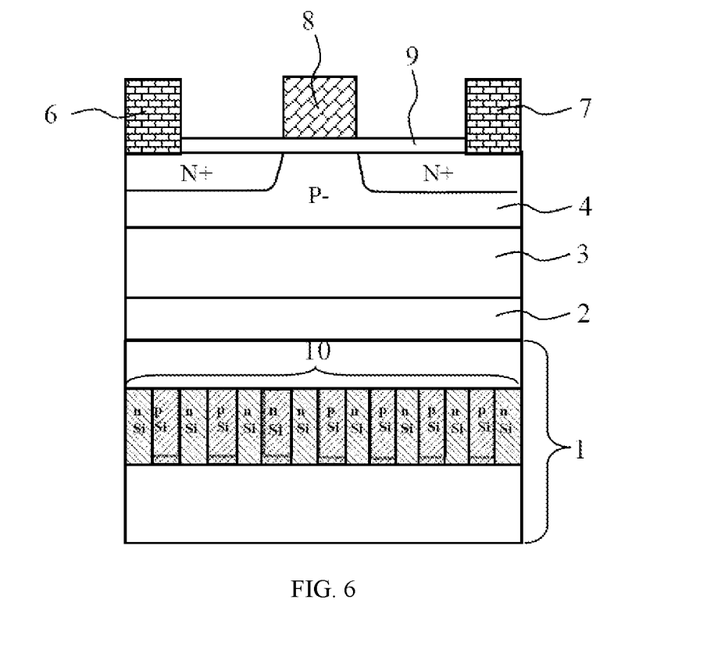
FIG. 6 is a schematic view illustrating a structure of a nitride MOSFET device according to a fifth embodiment of the present invention.

FIG. 6 is a schematic view illustrating a structure of a nitride MOSFET device according to a fifth embodiment of the present invention. In the present embodiment, the differently doped semiconductor composite structure 10 is introduced in a silicon substrate 1 of a nitride n-channel MOSFET device, thus the breakdown voltage of the device is greatly improved. The regions of the nitride channel layer 4 which are respectively located below the source electrode 6 and the drain electrode 7 are n-type heavily doped regions in which silicon is generally doped, and the region below the gate electrode 8 is a p-type lightly doped region in which magnesium is generally doped. The dielectric layer 9 below the gate metal typically contains $SiO_2$ or other oxide.

Figure 7:
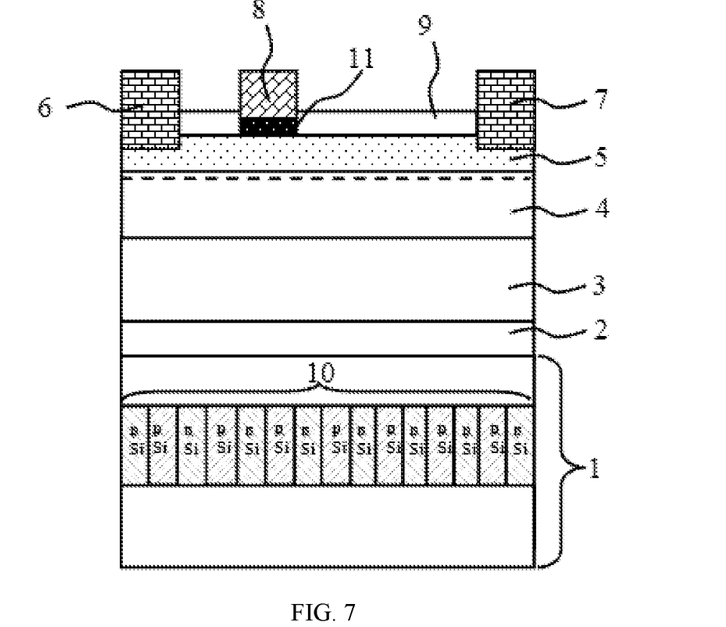
FIG. 7 is a schematic view illustrating a structure of a nitride MIS-HEMT device according to a sixth embodiment of the present invention.

FIG. 7 is a schematic view illustrating a structure of a nitride MIS-HEMT device according to a sixth embodiment of the present invention. In the present embodiment, the differently doped semiconductor composite structure 10 is introduced in a silicon substrate 1 of a nitride MIS-HEMT device, thus the breakdown voltage of the device is improved. The gate dielectric layer 11 under the gate electrode 8 comprises one selected from SiN, $SiO_2$, SiON, $Al_2O_3$, $HfO_2$, $HfAlO_x$ or any combination thereof.

Figure 8:
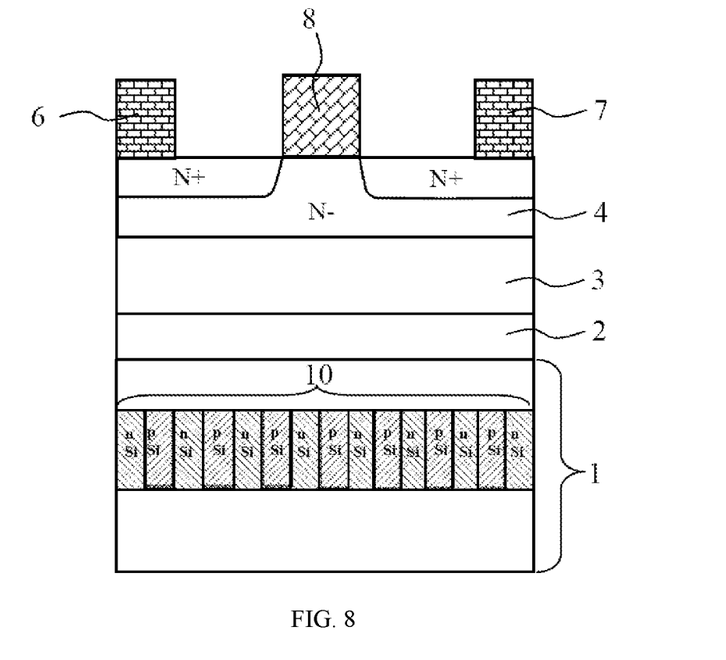
FIG. 8 is a schematic view illustrating a structure of a nitride MESFET device according to a seventh embodiment of the present invention.

FIG. 8 is a schematic view illustrating a structure of a nitride MESFET device according to a seventh embodiment of the present invention. In the present embodiment, the differently doped semiconductor composite structure 10 is introduced in a silicon substrate 1 of a nitride MESFET device, thus the breakdown voltage of the device is improved. Here, the nitride channel layer 4 is typically n-type lightly doped, the portions of the nitride channel 4 below the source electrode 6 and the drain electrode 7 are n-type heavily doped, and the gate electrode 8 is a Schottky junction.

Figure 9:
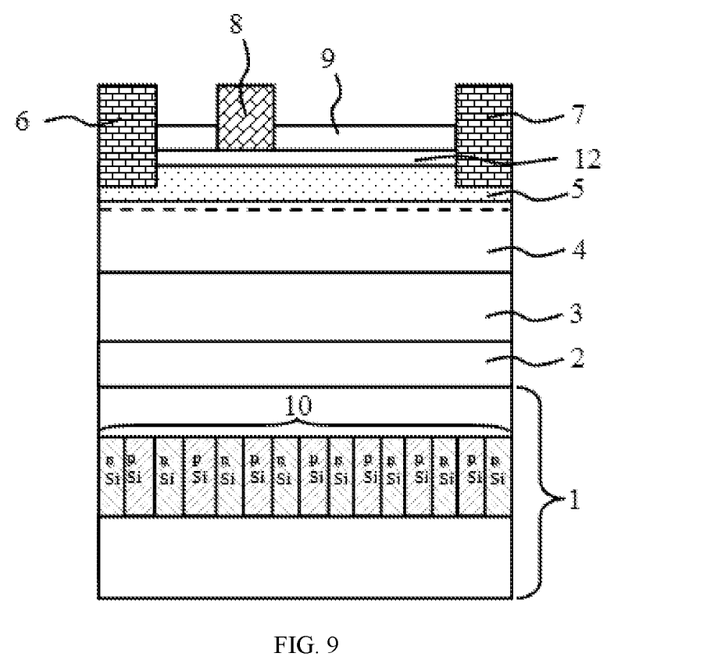
FIG. 9 is a schematic view illustrating a structure of a nitride HEMT device according to an eighth embodiment of the present invention.

FIG. 9 is a schematic view illustrating a structure of a nitride MESFET device according to an eighth embodiment of the present invention. In the present embodiment, a GaN capping layer 12 is grown on the nitride barrier layer 5. Due to surface defect and high surface state density of the AlGaN barrier layer material, a large amount of electrons will be captured, which will affect the two-dimensional electron gas in the channel and hence reduce characteristics and reliability of the device. Growing a GaN layer on the surface of the barrier layer as a protection layer can effectively decrease impact on the characteristics of the device by the surface defect and the surface state density of the barrier layer material.

Figure 10:
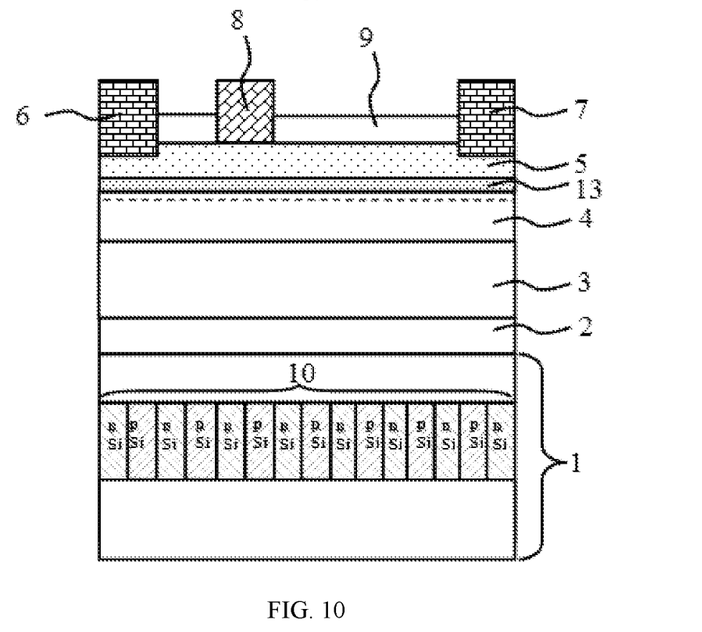
FIG. 10 is a schematic view illustrating a structure of a nitride HEMT device according to a ninth embodiment of the present invention.

FIG. 10 is a schematic view illustrating a structure of a nitride MESFET device according to a ninth embodiment of the present invention. In the present embodiment, an AlN insertion layer 13 is introduced between the barrier layer and the channel layer. Since AlN has a large band gap, electrons can be confined in a heterojunction potential well effectively, which increases the concentration of the two-dimensional electron gas. In addition, the AlN insertion layer separates the conductive channel from the AlGaN barrier layer, which reduces the scattering effect on electrons by the barrier layer, thus improving the mobility of electrons and improving the overall characteristics of the device.

Figure 11:
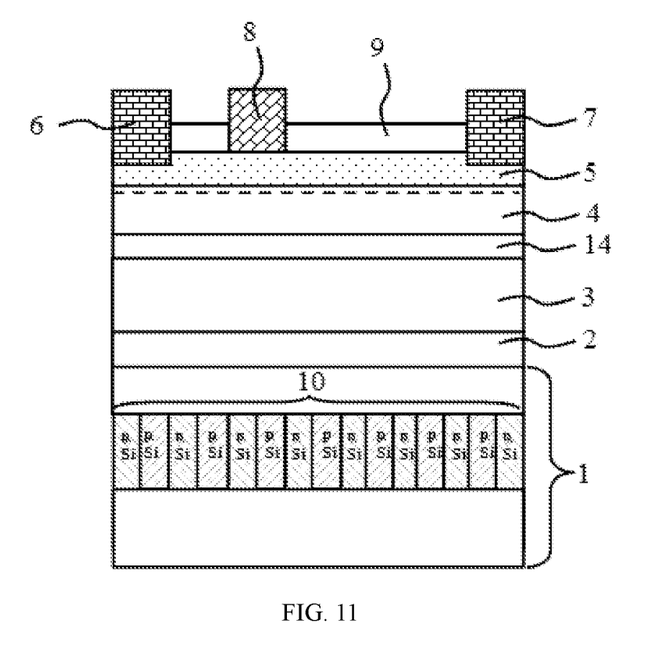
FIG. 11 is a schematic view illustrating a structure of a nitride HEMT device according to a tenth embodiment of the present invention.

FIG. 11 is a schematic view illustrating a structure of a nitride MESFET device according to a tenth embodiment of the present invention. In the present embodiment, an AlGaN back barrier layer 14 is introduced between the nitride buffer layer 3 and the nitride channel layer 4. Under a certain external voltage, electrons in the channel will enter into the buffer layer. This phenomenon is very serious in a short-channel device. In this case, the control on electrons in the channel by the gate electrode becomes weak, leading to the short-channel effect. Moreover, there are a large amount of defects and impurities in the buffer layer, which affects the two-dimensional electron gas in the channel, for example results in current collapse. The AlGaN back barrier layer 14 can separate the channel electrons from the buffer layer and effectively confine the two-dimensional electron gas in the channel layer, which avoids the short-channel effect and the current collapse effect.

Further, on the basis of the present invention, an enhanced nitride power transistor device can be manufactured by changing the structure or manufacturing process of the nitride channel layer or the barrier layer on the silicon substrate, for example, by bombarding the material region below the gate metal with fluorine ions.

With the above-described embodiments, the nitride power transistor obtained by the method of manufacturing the nitride power transistor according to the present invention has the following advantageous effects.

With introduction of a differently doped semiconductor composite structure for forming a space charge depletion region inside a silicon substrate of a nitride power transistor, the nitride power transistor is capable of withstanding a relatively high external voltage, and thus a breakdown voltage of the device is improved. Growing a GaN layer on the surface of the barrier layer as a protection layer can effectively decrease impact on the characteristics of the device by the surface defect and the surface state density of the barrier layer material. The AlN insertion layer increases the concentration of the two-dimensional electron gas, improves the mobility of electrons and the overall characteristics of the device. The AlGaN back barrier layer can separate the channel electrons from the buffer layer and effectively confine the two-dimensional electron gas in the channel layer, which avoids the short-channel effect and the current collapse effect.

For those skilled in the art, apparently the present invention is not limited to the details of the above-described exemplary embodiments, rather, other implementations can be used to realize the present invention without departing from the spirit or essential characteristics of the present invention. Thus, in all cases the embodiments should be construed as exemplary, rather than limiting. The scope of the present invention is defined by the appended claims rather than the foregoing description, thus all modifications within meaning and range of the appended claims and equivalents thereof are included in the present invention. Any reference numeral in the claims should not be construed as limiting the claims.

Further, it should be understood that although the present specification is described with reference to embodiments, not each embodiment contains only one independent technical scheme. The specification is so described just for clarity. Those skilled in the art should regard the specification as a whole, technical schemes of various embodiments can be combined appropriately to form other implementations which can be understood by those skilled in the art.

What is claimed is:

1. A nitride power transistor, comprising:
   a silicon substrate comprising a differently doped semiconductor composite structure for forming a space charge depletion region; and
   a nitride epitaxial layer located on the silicon substrate,
   wherein the semiconductor composite structure is a multi-level structure formed by transversely alternating n-type semiconductor and p-type semiconductor along a direction parallel to a surface of the silicon substrate facing away from the nitride epitaxial layer, and the semiconductor composite structure is located in the bottom of the silicon substrate, such that a surface of the semiconductor composite structure facing away from the nitride epitaxial layer and the surface of the silicon substrate facing away from the nitride epitaxial layer are coplanar.

2. The nitride power transistor according to claim 1, wherein a longitudinal section of the semiconductor composite structure has one of a longitudinal vertical arrangement, a cross section of the semiconductor composite structure has one of a longitudinal alternating grid arrangement, a longitudinal alternating triangular arrangement, a longitudinal alternating polygonal arrangement and a longitudinal alternating circular arrangement or any combination thereof, and the semiconductor composite structure occupies the entire silicon substrate in a transverse direction.

3. The nitride power transistor according to claim 1, wherein a height of the n-type semiconductor and the p-type semiconductor of the semiconductor composite structure is more than 5 nm.

4. The nitride power transistor according to claim 1, wherein doping concentration and doping distribution of each layer of the silicon substrate and the semiconductor composite structure in the silicon substrate includes light doping, graded doping, heavy doping or any combination thereof.

5. The nitride power transistor according to claim 1, further comprising a nitride barrier layer disposed on the nitride epitaxial layer,
   wherein two-dimensional electron gas is formed at an interface between the nitride epitaxial layer and the nitride barrier layer.

6. The nitride power transistor according to claim 5, further comprising a dielectric layer disposed on the nitride barrier layer,
   wherein the dielectric layer includes one selected from SiN, $SiO_2$, SiON, $Al_2O_3$, $HfO_2$, $HfAlO_x$ and any combination thereof.

7. The nitride power transistor according to claim 5, further comprising a GaN capping layer disposed on the nitride barrier layer.

8. The nitride power transistor according to claim 5, further comprising an AlN insertion layer disposed between the nitride barrier layer and the nitride epitaxial layer.

9. The nitride power transistor according to claim 1, wherein the nitride epitaxial layer comprises:
   a nitride nucleation layer located on the silicon substrate;
   a nitride buffer layer located on the nitride nucleation layer; and
   a nitride channel layer located on the nitride buffer layer, and
   wherein the nitride power transistor further comprises a source electrode and a drain electrode contacting the nitride channel layer and a gate electrode located between the source electrode and the drain electrode.

10. The nitride power transistor according to claim 9, further comprising an AlGaN back barrier layer disposed between the nitride buffer layer and the nitride channel layer.

11. The nitride power transistor according to claim 9, wherein regions of the nitride channel layer which are respectively located below the source electrode and the drain electrode are n-type heavily doped, and a region of the nitride channel layer which is located below the gate electrode is unintentionally doped, p-type lightly doped or n-type lightly doped.

12. A method of manufacturing a nitride power transistor, comprising:
   introducing a differently doped semiconductor composite structure for forming a space charge depletion region inside a silicon substrate; and
   growing a nitride epitaxial layer on the silicon substrate having the semiconductor composite structure,
   wherein the semiconductor composite structure is a multi-level structure formed by transversely alternating n-type semiconductor and p-type semiconductor along a direction parallel to a surface of the silicon substrate facing away from the nitride epitaxial layer, and the semiconductor composite structure is located in the bottom of the silicon substrate, such that a surface of the semiconductor composite structure facing away from the nitride epitaxial layer and the surface of the silicon substrate facing away from the nitride epitaxial layer are coplanar.

13. The method according to claim 12, wherein a manufacturing method of the semiconductor composite structure comprises etching and epitaxial growth.

14. The method according to claim 12, wherein a manufacturing method of the semiconductor composite structure comprises ion implantation.

15. The method according to claim 12, wherein a longitudinal section of the semiconductor composite structure has one of a longitudinal vertical arrangement, a triangular arrangement and a square arrangement or any combination thereof, a cross section of the semiconductor composite structure has one of a longitudinal alternating grid arrangement, a longitudinal alternating triangular arrangement, a longitudinal alternating polygonal arrangement and a longitudinal alternating circular arrangement or any combination thereof, and the semiconductor composite structure occupies the entire silicon substrate in a transverse direction.

* * * * *